(12) United States Patent
Udaka et al.

(10) Patent No.: US 11,183,654 B2
(45) Date of Patent: *Nov. 23, 2021

(54) PHOTOELECTRIC CONVERSION ELEMENT, IMAGING DEVICE, AND OPTICAL SENSOR

(71) Applicant: SONY CORPORATION, Tokyo (JP)

(72) Inventors: Toru Udaka, Kanagawa (JP); Masaki Murata, Tokyo (JP); Rui Morimoto, Kanagawa (JP); Osamu Enoki, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/857,974

(22) Filed: Apr. 24, 2020

(65) Prior Publication Data
US 2020/0251672 A1 Aug. 6, 2020

Related U.S. Application Data

(63) Continuation of application No. 16/249,489, filed on Jan. 16, 2019, now Pat. No. 10,665,802, which is a
(Continued)

(30) Foreign Application Priority Data

Aug. 9, 2012 (JP) ................................. 2012-176691

(51) Int. Cl.
*H01L 51/42* (2006.01)
*H01L 27/30* (2006.01)
*H01L 51/00* (2006.01)

(52) U.S. Cl.
CPC .......... *H01L 51/424* (2013.01); *H01L 27/302* (2013.01); *H01L 27/307* (2013.01);
(Continued)

(58) Field of Classification Search
CPC combination set(s) only.
See application file for complete search history.

(56) References Cited

U.S. PATENT DOCUMENTS 5,350,459 A 9/1994 Suzuki et al.
10,199,587 B2 * 2/2019 Udaka .................. H01L 27/307
(Continued)

FOREIGN PATENT DOCUMENTS

JP 62-222668 A 9/1987
JP 63-300576 A 12/1988
(Continued)

OTHER PUBLICATIONS

Non-Final Office Action for U.S. Appl. No. 16/249,489, dated Mar. 20, 2019, 12 pages.
(Continued)

*Primary Examiner* — Nduka E Ojeh
(74) *Attorney, Agent, or Firm* — Chip Law Group

(57) ABSTRACT

An organic photoelectric conversion element, an imaging device, and an optical sensor, which can detect a plurality of wavelength regions by a single element structure, are provided. The photoelectric conversion element is formed by providing an organic photoelectric conversion portion including two or more types of organic semiconductor materials having different spectral sensitivities between the first and the second electrodes. Wavelength sensitivity characteristics of the photoelectric conversion element change according to a voltage (bias voltage) applied between the first and the second electrodes. The photoelectric conversion element is mounted in the imaging device and the optical sensor.

8 Claims, 4 Drawing Sheets

Related U.S. Application Data continuation of application No. 14/419,148, filed as application No. PCT/JP2013/067048 on Jun. 21, 2013, now Pat. No. 10,199,587.

(52) U.S. Cl.
CPC ........ *H01L 51/4246* (2013.01); *H01L 51/001* (2013.01); *H01L 51/0053* (2013.01); *Y02E 10/549* (2013.01)

(56) References Cited

U.S. PATENT DOCUMENTS

| | | | |
|---|---|---|---|
| 10,665,802 B2 * | 5/2020 | Udaka | H01L 51/424 |
| 2005/0205908 A1 | 9/2005 | Fukuzumi | |
| 2007/0228503 A1 | 10/2007 | Yokoyama | |
| 2009/0101953 A1 * | 4/2009 | Hayashi | H01L 27/14629 257/292 |
| 2009/0229668 A1 | 9/2009 | Kim et al. | |
| 2009/0294761 A1 | 12/2009 | Kim et al. | |
| 2010/0012189 A1 * | 1/2010 | Sakai | H01L 51/4246 136/261 |
| 2011/0001128 A1 | 1/2011 | Kim et al. | |
| 2012/0098079 A1 | 4/2012 | Suzuki | |
| 2013/0098449 A1 * | 4/2013 | Okubo | H01L 51/0072 136/263 |
| 2013/0337603 A1 * | 12/2013 | Steinhauser | H01L 31/202 438/96 |
| 2014/0209173 A1 | 7/2014 | Momose | |
| 2014/0360585 A1 | 12/2014 | Sugiura et al. | |
| 2015/0129861 A1 | 5/2015 | Hamano et al. | |

FOREIGN PATENT DOCUMENTS

| | | |
|---|---|---|
| JP | 04-337674 A | 11/1992 |
| JP | 05-308146 A | 11/1993 |
| JP | 06-177410 A | 6/1994 |
| JP | 06-318725 A | 11/1994 |
| JP | 2002-217474 A | 8/2002 |
| JP | 2003-158254 A | 5/2003 |
| JP | 2003-234460 A | 8/2003 |
| JP | 2003-332551 A | 11/2003 |
| JP | 2005-085933 A | 3/2005 |
| JP | 2005-303266 A | 10/2005 |
| JP | 2007-273894 A | 10/2007 |
| JP | 2008-227092 A | 9/2008 |
| JP | 2009-117480 A | 5/2009 |
| JP | 2011-199152 A | 10/2011 |

OTHER PUBLICATIONS

Final Office Action for U.S. Appl. No. 16/249,489, dated Aug. 28, 2019, 16 pages.
Advisory Action for U.S. Appl. No. 16/249,489, dated Nov. 26, 2019, 06 pages.
Notice of Allowance for U.S. Appl. No. 16/249,489, dated Jan. 23, 2020, 09 pages.
Non-Final Office Action for U.S. Appl. No. 14/419,148, dated Oct. 6, 2015, 12 pages.
Non-Final Office Action for U.S. Appl. No. 14/419,148, dated Jul. 14, 2016, 12 pages.
Non-Final Office Action for U.S. Appl. No. 14/419,148, dated Apr. 3, 2017, 19 pages.
Non-Final Office Action for U.S. Appl. No. 14/419,148, dated Jan. 11, 2018, 22 pages.
Final Office Action for U.S. Appl. No. 14/419,148, dated Mar. 23, 2016, 14 pages.
Final Office Action for U.S. Appl. No. 14/419,148, dated Dec. 15, 2016, 21 pages.
Final Office Action for U.S. Appl. No. 14/419,148, dated Aug. 10, 2017, 22 pages.
Final Office Action for U.S. Appl. No. 14/419,148, dated Jun. 26, 2018, 21 pages.
Advisory Action for U.S. Appl. No. 14/419,148, dated May 25, 2016, 03 pages.
Advisory Action for U.S. Appl. No. 14/419,148, dated Mar. 2, 2017, 03 pages.
Advisory Action for U.S. Appl. No. 14/419,148, dated Oct. 17, 2017, 03 pages.
Notice of Allowance for U.S. Appl. No. 14/419,148, dated Sep. 28, 2018, 10 pages.
Office Action for JP Patent Application No. 2014-529348, dated Nov. 6, 2018, 08 pages of Office Action.
Office Action for JP Patent Application No. 2017-156806, dated Nov. 6, 2018, 06 pages of Office Action and 04 pages of English Translation.
International Search Report and Written Opinion of PCT Application No. PCT/JP2013/067048, dated Jul. 30, 2013, 07 pages of English Translation and 07 pages of ISRWO.
International Preliminary Report on Patentability of PCT Application No. PCT/JP2013/067048, dated Feb. 19, 2015, 07 pages of English Translation and 04 pages of IPRP.
Office Action for JP Patent Application No. 2019-019286 dated Nov. 17, 2020, 03 pages of Office Action and 03 pages of English Translation.
Office Action for JP Patent Application No. 2019-019286, dated Jun. 15, 2021, 03 pages of Office Action and 02 pages of English Translation.

* cited by examiner

PHOTOELECTRIC CONVERSION ELEMENT, IMAGING DEVICE, AND OPTICAL SENSOR

CROSS-REFERENCE TO RELATED APPLICATIONS

The present application is a continuation application of U.S. patent application Ser. No. 16/249,489, filed Jan. 16, 2019, which is a continuation application of U.S. patent application Ser. No. 14/419,148, filed Feb. 2, 2015, now U.S. Pat. No. 10,199,587, which is a National Stage Entry of PCT/JP2013/067048, filed Jun. 21, 2013, and claims the benefit of priority from prior Japanese Patent Application JP 2012-176691, filed Aug. 9, 2012, the entire content of which is hereby incorporated by reference.

TECHNICAL FIELD

The present technique relates to a photoelectric conversion element, and an imaging device and an optical sensor which include the photoelectric conversion element. More specifically, the present technique relates to an organic photoelectric conversion element, an imaging device, and an optical sensor, which use an organic photoelectric conversion material.

BACKGROUND ART

Conventionally, a charge coupled device (CCD) and a semiconductor element of a complementary metal oxide semiconductor (CMOS) structure are mainly used as an imaging element (image sensor). Further, in recent years, an imaging element is proposed which uses an organic photoelectric conversion element whose photoelectric conversion layer is formed of an organic semiconductor material (for example, see Patent Documents 1 to 5). The organic photoelectric conversion element has characteristics that a color filter is not required and a structure and a manufacturing process can be simplified as compared with a conventional inorganic semiconductor element.

Specifically, Patent Document 1 discloses a color sensor having a structure in which a first organic dye layer and a second organic dye layer are provided between a first conductive material and a second conductive material and a third conductive material is provided between these organic dye layers. Patent Documents 2 to 4 disclose an imaging element having a structure in which two or three types of light receiving portions formed of an organic photoelectric material having an absorption peak at a wavelength corresponding to R (red), G (green), or B (blue) are laminated.

Each of the imaging elements described in Patent Documents 2 to 4 is provided with a pair of electrodes for each light receiving portion. On the other hand, Patent Document 5 discloses a photoelectric conversion element having a structure in which a plurality of organic photoelectric conversion films having different absorption spectra are laminated between a pair of electrodes. An imaging element described in Patent Document 5 controls a range from which charge is extracted and switches a wavelength region to be detected by changing a voltage applied between the pair of electrodes.

CITATION LIST

Patent Document

Patent Document 1: JP 63-300576 A
Patent Document 2: JP 2003-234460 A
Patent Document 3: JP 2003-332551 A
Patent Document 4: JP 2005-303266 A
Patent Document 5: JP 2008-227092 A

SUMMARY OF THE INVENTION

Problems to be Solved by the Invention

However, the conventional organic photoelectric conversion elements described above have problems described below. First, an organic photoelectric conversion element having a structure in which monochromatic sensors are laminated, such as the elements described in Patent Documents 1 to 4, has to be provided with a module (a light receiving portion) for each wavelength of an object to be detected, so that there is a problem that the structure is complicated and a manufacturing cycle time is long. In order to detect a plurality of wavelength regions and a wide range of wavelength region by using an organic photoelectric conversion element having such a structure, it is necessary to form a plurality of organic photoelectric conversion layers having different light absorption peaks and form electrodes, the number of which is twice the number of the organic photoelectric conversion layers.

On the other hand, when a structure like that of the element described in Patent Document 5 is employed, it is possible to reduce the number of electrodes. However, it is not possible to expect a color change in a visible range when employing the imaging element. Specifically, the element described in Patent Document 5 is designed so that, for example, a first photoelectric conversion film has an absorption spectrum similar to that of a spectral sensitivity characteristic in a photopic vision of a human being and a second photoelectric conversion film has an absorption peak wavelength of absorption spectrum in an infrared region within a range of a visible region and an infrared region. Further, the imaging element described in Patent Document 5 has a structure in which the photoelectric conversion layer is thick, so that there is a problem that the electric field strength is weak.

Therefore, a main object of the present disclosure is to provide an organic photoelectric conversion element, an imaging device, and an optical sensor, which can detect a plurality of wavelength regions by a single element structure.

Solutions to Problems

A photoelectric conversion element according to the present disclosure includes a first electrode, a second electrode, and an organic photoelectric conversion portion which is provided between the first and the second electrodes and which includes two or more types of organic semiconductor materials having different wavelength sensitivities. Wavelength sensitivity characteristics of the photoelectric conversion element change according to a voltage applied between the first and the second electrodes.

In the photoelectric conversion element, the organic photoelectric conversion portion may be formed of a single layer including two or more types of organic semiconductor materials having different wavelength sensitivities.

In this case, the organic photoelectric conversion portion can be formed by, for example, co-depositing the two or more types of organic semiconductor materials. The organic photoelectric conversion portion may have a configuration in which two or more organic semiconductor layers which have different wavelength sensitivities and which include one type or two or more types of organic semiconductor material(s) are laminated.

In this case, the organic photoelectric conversion portion may have a configuration in which a layer formed of a first organic semiconductor material and a layer formed of a second organic semiconductor material having a wavelength sensitivity different from that of the first organic semiconductor material are alternately laminated. On the other hand, the organic photoelectric conversion portion may be formed of a p-type organic semiconductor material and an n-type organic semiconductor material. Further, the first electrode and/or the second electrode can be formed of a transparent material.

An imaging device according to the present disclosure includes the photoelectric conversion element described above.

An optical sensor according to the present disclosure includes the photoelectric conversion element described above and a detection wavelength region of the optical sensor changes according to a voltage applied between the first and the second electrodes.

Effects of the Invention

According to the present disclosure, the organic photoelectric conversion portion includes two or more types of organic semiconductor materials having different wavelength sensitivities and the wavelength sensitivity characteristics change according to a voltage, so that it is possible to detect a plurality of wavelength regions even when a light receiving portion, which is provided for each detection wavelength in a conventional manner, is not provided for each detection wavelength.

MODES FOR CARRYING OUT THE INVENTION

Hereinafter, modes for carrying out the present disclosure will be described in detail with reference to the drawings. The present disclosure is not limited to the embodiments described below. The order of the description is as follows:

1. First Embodiment
(An example of a photoelectric conversion element in which a photoelectric conversion portion is formed of one organic semiconductor layer)
2. Second Embodiment
(An example of a photoelectric conversion element in which two or more organic semiconductor layers having different wavelength sensitivities are laminated)
3. Third Embodiment
(An example of an imaging device using a photoelectric conversion element including two or more types of organic photoelectric conversion materials)

1. First Embodiment

Figure 1:
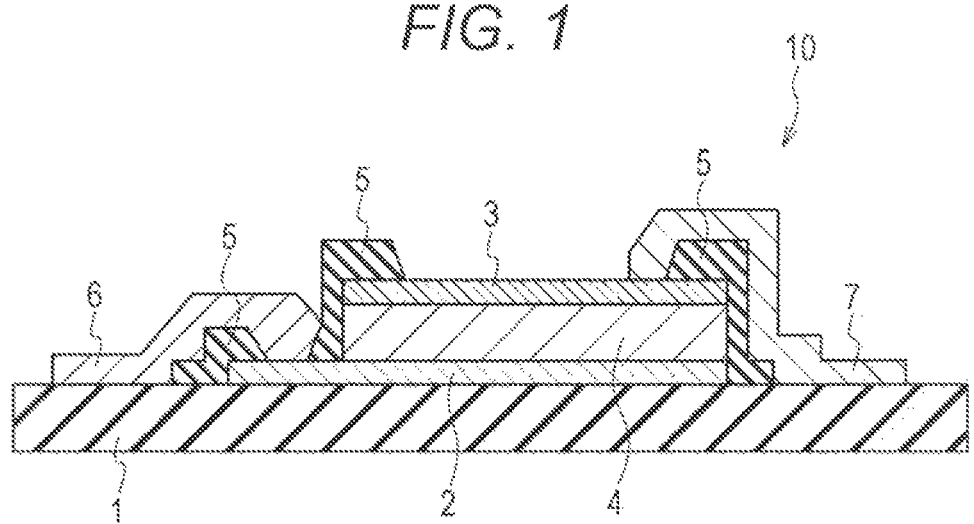
FIG. 1 is a cross-sectional view schematically showing a configuration of a photoelectric conversion element of a first embodiment of the present disclosure.

First, a photoelectric conversion element according to a first embodiment of the present disclosure will be described. FIG. 1 is a cross-sectional view schematically showing a configuration of the photoelectric conversion element of the first embodiment of the present disclosure. As shown in FIG. 1, in a photoelectric conversion element 10 of the first embodiment, an electrode 2, an organic photoelectric conversion portion 4, and an electrode 3 are laminated on a substrate 1 in this order. In other words, in the photoelectric conversion element 10, the organic photoelectric conversion portion 4 is provided between a pair of electrodes 2 and 3.

Substrate 1

The substrate 1 may be any substrate capable of supporting the electrodes 2 and 3, the organic photoelectric conversion portion 4, and the like. The material and shape are not particularly limited. Examples of materials forming the substrate 1 include synthetic resins such as polymethylmethacrylate (PMMA), polyvinyl alcohol (PVA), polyvinyl phenol (PVP), polyether sulfone (PES), polyimide, polycarbonate (PC), polyethylene terephthalate (PET), and polyethylene naphthalate (PEN).

When the substrate 1 is formed of a synthetic resin, the substrate 1 may have a film shape, and a sheet shape, and the like, in addition to a plate shape. When using the substrate 1 having flexibility, for example, it is possible to incorporate or integrate an electronic device into an electronic apparatus having a curved surface shape.

The substrate 1 may be formed of an inorganic material such as mica, glass, and quartz. Further, as the substrate 1, it is possible to use a substrate in which an insulating film formed of, for example, silicon oxide, silicon oxynitride, aluminum oxide, metallic oxide, or metallic salt is formed on a surface of a glass substrate, a quartz substrate, a silicon substrate, a metal substrate, a carbon substrate, or the like.

For example, when light is received through the substrate 1, it is preferable that the substrate 1 is formed of a transparent material. Here, the "transparent material" indicates a material that does not excessively absorb light entering the organic photoelectric conversion portion 4. The same goes for the description below. It is desirable that the surface of the substrate 1 is flat and smooth. However, there may be unevenness in a range that does not affect the characteristics of the organic photoelectric conversion portion 4. A surface treatment may be performed on the surface of the substrate 1 in order to improve adhesiveness to an electrode and an insulating layer formed on the substrate 1.

Electrodes 2 and 3

The electrodes 2 and 3 can be formed of a transparent material with conductivity, such as indium tin oxide (including ITO, Sn-doped $In_2O_3$, crystalline ITO, and amorphous ITO), IFO (F-doped $In_2O_3$), tin oxide ($SnO_2$), ATO (Sb-doped $SnO_2$), FTO (F-doped $SnO_2$), zinc oxide (including Al-doped ZnO, B-doped ZnO, and Ga-doped ZnO), indium oxide-zinc oxide (IZO), titanium oxide (TiO$_2$), spinel-based oxide, and oxide having a YbFe$_2$O$_4$ structure.

Of the electrodes 2 and 3, the electrode which light does not enter may have low transparency. In this case, an electrode 21 can be formed of a metallic material such as platinum (Pt), gold (Au), palladium (Pd), chrome (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (mo), and an alloy material including these metallic elements.

The electrodes 2 and 3 may also be formed of a conductive material such as conductive particles including the metals or the alloys described above, a polysilicon including impurities, a carbon-based material, an oxide semiconductor, carbon nanotubes, and grapheme. In this case, the electrode 21 may be formed by mixing these conductive materials with a binder resin to form a paste or an ink and hardening the paste or the ink. Further, the electrodes 2 and 3 may also be formed of a conductive polymer material such as poly(3,4-ethylene dioxythiophene) and polystyrene sulfonate. Further, the electrodes 2 and 3 may have a structure in which two or more layers formed of different materials are laminated.

A method of forming the electrodes 2 and 3 are not particularly limited, but can be appropriately selected according to the electrode material. Specifically, to form the electrodes 2 and 3, it is possible to apply a vacuum deposition method, a reactive deposition method, various sputtering methods, an electron beam deposition method, a physical vapor deposition method (PVD method) such as an ion plating method, a pyrosol method, a method of thermally decomposing an organic metallic compound, a spraying method, a dip method, various chemical vapor deposition methods (CVD methods) including a MOCVD method, various plating methods such as an electroless plating method and an electrolytic plating method, a lift-off method, a sol-gel method, an electrodeposition method, a shadow mask method, and the like. Further, these methods may be combined and performed. Further, these methods can be combined with a patterning technique and performed.

Organic Photoelectric Conversion Portion 4

The organic photoelectric conversion portion 4 is formed of an organic semiconductor layer including two or more types of organic semiconductor materials having different wavelength sensitivities. The organic semiconductor materials contained in the organic semiconductor layer forming the organic photoelectric conversion portion 4 are not particularly limited as long as the organic semiconductor materials have different wavelength sensitivities. However, for example, it is possible to combine and use a p-type organic semiconductor material and an n-type organic semiconductor material.

A donor property or an acceptor property of each material changes depending on the combination. Therefore, when a p-type organic semiconductor material and an n-type organic semiconductor material are combined and used, it is preferable to design a device structure according to the combination. Specifically, from a HOMO (Highest Occupied Molecular Orbital)/LUMO (Lowest Unoccupied Molecular Orbital) level of molecules, for example, molecules whose HOMO level is shallow can be determined as p-type and molecules whose HOMO level is low can be determined as n-type.

The thickness of the organic photoelectric conversion portion (organic semiconductor layer) 4 is not particularly limited, but from a viewpoint of ensuring the electric field strength, the thickness is preferable to be 20 to 500 nm and more preferable to be 50 to 200 nm.

The organic photoelectric conversion portion (organic semiconductor layer) 4 can be formed by co-depositing two or more types of organic semiconductor materials by a physical vapor deposition (PVD) method, a metal organic chemical vapor deposition (MOCVD) method, and the like. Here, examples of the PVD method include a vacuum deposition method using various heating methods such as an electron beam heating method, a resistance heating method, a lamp heating method, and a high frequency induction heating method, a plasma deposition method, various sputtering methods such as a double-pole sputtering method, a DC sputtering method, a DC magnetron sputtering method, a high frequency sputtering method, a magnetron sputtering method, an ion beam sputtering method, and a bias sputtering method, a DC (direct current) method, an RF method, a multi-cathode method, an activated reaction method, an electric field deposition method, and various ion plating methods such as a high frequency ion plating method and a reactive ion plating method.

The method of forming the organic photoelectric conversion portion (organic semiconductor layer) 4 is not limited to the co-deposition. The organic photoelectric conversion portion (organic semiconductor layer) 4 can be formed by a coating method by using an ink containing two or more types of organic semiconductor materials having different wavelength sensitivities. In this case, examples of the coating method include various coating methods such as a spin coat method, a dipping method, a cast method, various printing method such as a screen printing method, an ink jet printing method, an offset printing method, and a gravure printing method, a stamp method, a spray method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. As a solvent, it is possible to use a non-polar or weakly polar organic solvent such as toluene, chloroform, hexane, and ethanol.

Other Configurations

The photoelectric conversion element 10 of the present embodiment may be provided with an electrode 6 to connect the electrode 2 with an external input/output terminal, an electrode 7 to connect the electrode 3 with an external input/output terminal, and an insulating layer 5 to prevent the electrodes 2 and 3 and the organic photoelectric conversion portion 4 from being short-circuited. Here, the insulating layer 5 is formed of, for example, silicon nitride or silicon oxide. A film forming method of the insulating layer 5 is not particularly limited, and for example, a vapor deposition method using a mechanical mask, a sputter method, and a CVD method can be applied.

On the other hand, the electrodes 6 and 7 can be formed of, for example, aluminum, copper, titanium, tungsten, tantalum, indium tin oxide (ITO), zinc oxide, tin oxide, magnesium oxide, gold, platinum, iridium, and palladium.

Operation

The wavelength sensitivity characteristics of the photoelectric conversion element 10 of the present embodiment change according to a voltage (bias voltage) applied between the electrode 2 and the electrode 3. For example, when the organic photoelectric conversion portion 4 contains quinacridone and perylenetetracarboxylic acid diimide (PTCDI), if the bias is low, the wavelength sensitivity characteristics of the quinacridone that behaves as a p-type molecule becomes dominant. On the other hand, if the bias is high, the wavelength sensitivity characteristics of the PTCDI that behaves as an n-type molecule expands.

As described above in detail, the organic photoelectric conversion portion 4 of the photoelectric conversion element 10 of the present embodiment is formed of a single layer including two or more types of organic semiconductor materials having different wavelength sensitivities, so that it is possible to expand a sensing band as compared with a case in which the organic photoelectric conversion portion 4 is formed of one type of organic semiconductor material. Further, the photoelectric conversion element 10 can shift the sensitivity wavelength by changing the bias voltage, so that it is possible to separate colors without a color filter even when a single element structure is employed.

Further, the photoelectric conversion element of the present embodiment has a simple element structure and the number of electrodes can be reduced to a minimum number, so that loss of incident light is small and light use efficiency is high. Therefore, the photoelectric conversion element 10 of the present embodiment can perform multi-spectral measurements by a single device, so that it is possible to realize high-sensitivity imaging element and optical sensor. The photoelectric conversion element 10 of the present embodiment is suitable as an imaging element.

2. Second Embodiment

Figure 2:
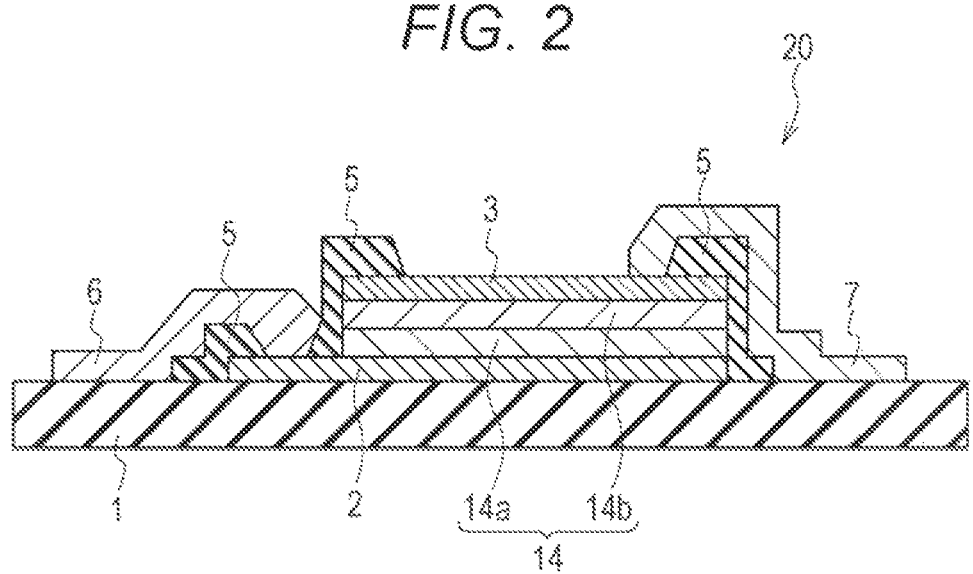
FIG. 2 is a cross-sectional view schematically showing a configuration of a photoelectric conversion element of a second embodiment of the present disclosure.

Next, a photoelectric conversion element according to a second embodiment of the present disclosure will be described. FIG. 2 is a cross-sectional view schematically showing a configuration of the photoelectric conversion element of the second embodiment of the present disclosure. In FIG. 2, the same components as those of the photoelectric conversion element 10 shown in FIG. 1 are denoted by the same reference numerals and the detailed description thereof will be omitted. As shown in FIG. 2, the photoelectric conversion element 20 of the present embodiment is the same as the photoelectric conversion element 10 of the first embodiment described above except that an organic photoelectric conversion portion 14 has a structure in which two or more organic semiconductor layers 14a and 14b are laminated.

Organic Photoelectric Conversion Portion 14

Each of the organic semiconductor layers 14a and 14b that form the organic photoelectric conversion portion 14 contains one type or two or more types of organic semiconductor material(s) and has a wavelength sensitivity different from each other. Thereby, in the same manner as the photoelectric conversion element of the first embodiment described above, it is possible to expand a sensitivity wavelength and change the wavelength sensitivity characteristics according to the voltage (bias voltage) applied between the electrode 2 and the electrode 3.

Here, the organic semiconductor materials contained in each of the organic semiconductor layers 14a and 14b are not particularly limited, and one type or two or more types of organic semiconductor material(s) may be contained as long as the wavelength sensitivity of each of the organic semiconductor layers 14a and 14b is different from each other. Further, for example, the organic semiconductor layer 14a can be formed of a p-type organic semiconductor material and the organic semiconductor layer 14b can be formed of an n-type organic semiconductor material.

The photoelectric conversion element 20 shown in FIG. 2 has a structure in which two organic semiconductor layers 14a and 14b having different wavelength sensitivities are laminated. However, the present disclosure is not limited to this, and three or more organic semiconductor layers having different wavelength sensitivities may be laminated. The organic photoelectric conversion portion 14 may have a structure in which a layer (the organic semiconductor layer 14a) formed of a first organic semiconductor material and a layer (the organic semiconductor layer 14b) formed of a second organic semiconductor material having a wavelength sensitivity different from that of the first organic semiconductor material are alternately laminated a plurality of times.

The organic photoelectric conversion portion 14 can be formed by, for example, alternately forming films of two or more types of organic semiconductor materials having different wavelength sensitivities by various CVD methods such as a PVD method and a MOCVD method. The organic photoelectric conversion portion 14 may be formed by a coating method such as laminated printing by using two or more types of inks containing organic semiconductor materials having different wavelength sensitivities.

Operation

In the same manner as the photoelectric conversion element 10 of the first embodiment described above, the wavelength sensitivity characteristics of the photoelectric conversion element 20 change according to a voltage (bias voltage) applied between the electrode 2 and the electrode 3.

As described above in detail, the organic photoelectric conversion portion 14 of the photoelectric conversion element 20 of the present embodiment is formed of two or more types of organic semiconductor layers 14a and 14b having different wavelength sensitivities, so that it is possible to expand a sensing band as compared with a case in which the organic photoelectric conversion portion 14 is formed of one type of organic semiconductor material. It is possible to adjust the wavelength sensitivity characteristics in more detail by changing the balance of concentrations of molecules of the organic semiconductor material for each expected center of sensitivity.

Further, the photoelectric conversion element 20 can also shift the sensitivity wavelength by changing the bias voltage, so that it is possible to detect a plurality of wavelength regions even when a single element structure is employed. The configurations, operations, and effects of the photoelectric conversion element 20 of the present embodiment other than the above are the same as those of the first embodiment described above. The photoelectric conversion element 20 of the present embodiment is also suitable as an imaging element.

3. Third Embodiment

Configuration

Figure 3:
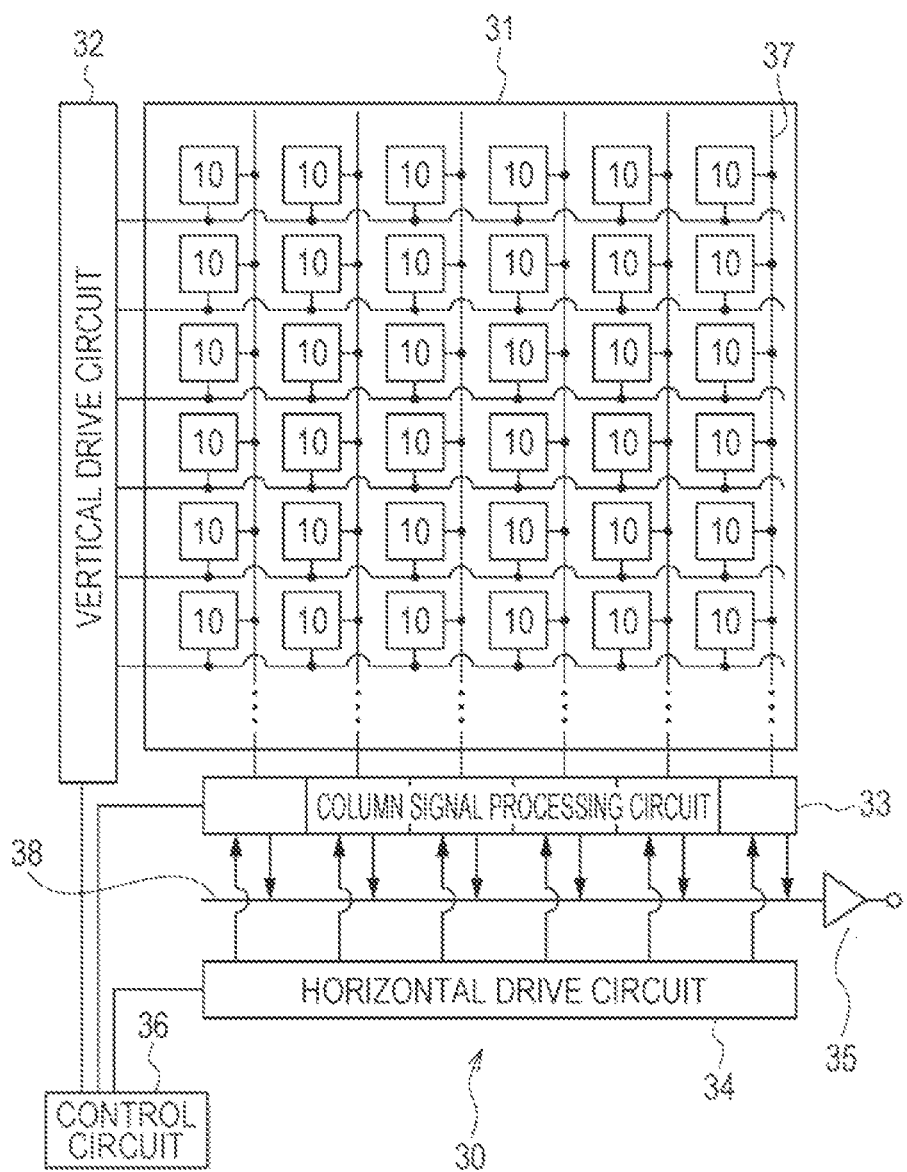
FIG. 3 is a diagram schematically showing a configuration of an imaging device of a third embodiment of the present disclosure.

Next, an imaging device according to a third embodiment of the present disclosure will be described. The imaging device according to the present embodiment uses the photoelectric conversion element 10 or 20 of the first or the second embodiment described above as an imaging element. FIG. 3 is a diagram schematically showing a configuration of the imaging device of the present embodiment. Although FIG. 3 shows a case in which the photoelectric conversion element 10 of the first embodiment is used, the imaging device 30 of the present embodiment can use the photoelectric conversion element 20 of the second embodiment, instead of the photoelectric conversion element 10.

As shown in FIG. 3, in the imaging device 30 of the present embodiment, for example, a plurality of photoelectric conversion elements 10 are arranged in a matrix form on a semiconductor substrate such as a Si substrate and a region in which the photoelectric conversion elements 10 are arranged functions as an imaging region 31. When integrating the photoelectric conversion elements 10 or 20 of the first or the second embodiment, a method of forming a pattern based on, for example, a PLD method (pulse laser deposition method) can be applied.

The imaging device 30 of the present embodiment is provided with a vertical drive circuit 32, a column signal processing circuit 33, a horizontal drive circuit 34, an output circuit 35, and a control circuit 36 as peripheral circuits of the imaging region 31.

The control circuit 36 generates a clock signal and a control signal to be reference of the operation of the vertical drive circuit 32, the column signal processing circuit 33, and the horizontal drive circuit 34 based on a vertical synchronizing signal, a horizontal synchronizing signal, and a master clock. The clock signal and the control signal generated by the control circuit 36 are input into the vertical drive circuit 32, the column signal processing circuit 33, and the horizontal drive circuit 34.

The vertical drive circuit 32 is configured by, for example, a shift resister and sequentially selects and scans the photoelectric conversion elements 10 in the imaging region 31 for each row in the vertical direction. A pixel signal based on a current (signal) generated according to the amount of light received in each photoelectric conversion element 10 in the vertical drive circuit 32 is transmitted to the column signal processing circuit 33 through a vertical signal line 37.

The column signal processing circuit 33 is arranged, for example, for each column of the photoelectric conversion elements 10 and performs signal processing such as noise removal and signal amplification on the signal output from the photoelectric conversion elements 10 of one row by using a signal of a black reference pixel (not shown in the drawings, but formed around an effective pixel region) for each photoelectric conversion element. At an output stage of the column signal processing circuit 33, a horizontal selection switch (not shown in the drawings) is provided to be connected with a horizontal signal line 38.

The horizontal drive circuit 34 is configured by, for example, a shift resister. The horizontal drive circuit 34 sequentially selects each of the column signal processing circuits 33 by sequentially outputting a horizontal scanning pulse and outputs a signal from each of the column signal processing circuits 33 to the horizontal signal line 38. The output circuit 35 performs signal processing on a signal sequentially supplied from each of the column signal processing circuits 33 through the horizontal signal line 38 and outputs the signal.

These circuits can be configured by a known circuit. The circuit configuration of the imaging device 30 of the present embodiment is not limited to the configuration described above, but other circuit configurations can be used, such as, for example, various circuits used in a conventional CCD imaging device and a conventional CMOS imaging device.

The imaging device 30 of the present embodiment uses a photoelectric conversion element including an organic photoelectric conversion portion containing two or more organic semiconductor materials having different spectral sensitivities, so that the imaging device 30 can perform two-color sensor recognition.

The first and second photoelectric conversion elements 10 and 20 described above can be used for, for example, an optical sensor in addition to the imaging device 30 described above. When the first and second photoelectric conversion elements 10 and 20 are used for an optical sensor, a detection wavelength region changes according to the voltage (bias voltage) applied between the electrodes 2 and 3.

The present disclosure may have the configuration as described below.

(1)

A photoelectric conversion element including
a first electrode,
a second electrode, and
an organic photoelectric conversion portion which is provided between the first and the second electrodes and which includes two or more types of organic semiconductor materials having different wavelength sensitivities,
in which wavelength sensitivity characteristics change according to a voltage applied between the first and the second electrodes.

(2)

The photoelectric conversion element described in (1), in which the organic photoelectric conversion portion is formed of a single layer including two or more types of organic semiconductor materials having different wavelength sensitivities.

(3)

The photoelectric conversion element described in (1) or (2), in which the organic photoelectric conversion portion is formed by co-depositing the two or more types of organic semiconductor materials.

(4)

The photoelectric conversion element described in (1), in which
the organic photoelectric conversion portion has a configuration in which two or more organic semiconductor layers having different wavelength sensitivities are laminated, and each organic semiconductor layer contains one type or two or more types of organic semiconductor material(s).

(5)

The photoelectric conversion element described in (1) or (4), in which, in the organic photoelectric conversion portion, a layer formed of a first organic semiconductor material and a layer formed of a second organic semiconductor material having a wavelength sensitivity different from that of the first organic semiconductor material are alternately laminated.

(6)

The photoelectric conversion element described in any of (1) to (5), in which the organic photoelectric conversion portion is formed of a p-type organic semiconductor material and an n-type organic semiconductor material.

(7)

The photoelectric conversion element described in any of (1) to (6), in which the first electrode and/or the second electrode are formed of a transparent material.

(8)

An imaging device including the photoelectric conversion element described in any of (1) to (7).

(9)

An optical sensor including the photoelectric conversion element described in any of (1) to (7), in which a detection wavelength region changes according to a voltage applied between the first and the second electrodes.

EXAMPLE

Figure 4:
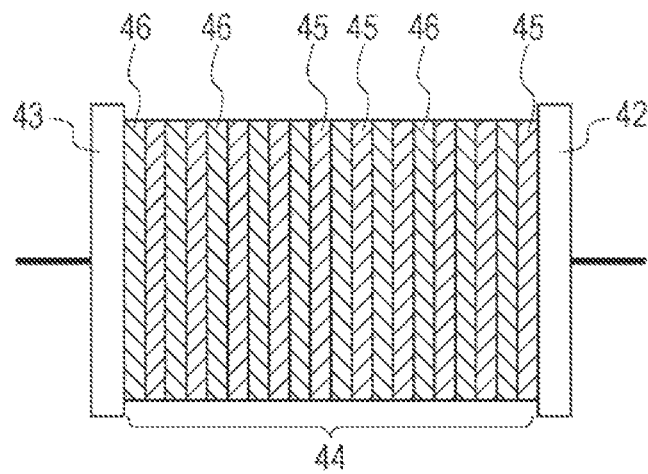
FIG. 4 is a diagram showing a configuration of an organic photoelectric conversion portion of a photoelectric conversion element used in an example of the present disclosure.

Hereinafter, effects of the present disclosure will be specifically described using an example of the disclosure. FIG. 4 is a diagram showing a configuration of a photoelectric conversion portion of a photoelectric conversion element used in the present example. In the present example, a photoelectric conversion element including an organic photoelectric conversion portion 44 shown in FIG. 4 is manufactured by using quinacridone (QD) and perylenetetracarboxylic acid diimide (PTCDI) as an organic semiconductor material, and the characteristics of the photoelectric conversion element are evaluated.

Specifically, PTCDI and QD are alternately laminated in this order ten times on a transparent electrode 42 where the electrode area has been limited by resist by using a vacuum deposition device having two or more evaporation sources, so that the organic photoelectric conversion portion 44 formed of PTCDI layers 45 and QD layers 46 is formed. In this case, the design thickness of each organic semiconductor layer (PTCDI layer 45 and QD layer 46) is set to 10 nm. Then, an aluminum film to be an electrode 43 is formed on the photoelectric conversion portion 44 by a vapor deposition method.

Figure 5:
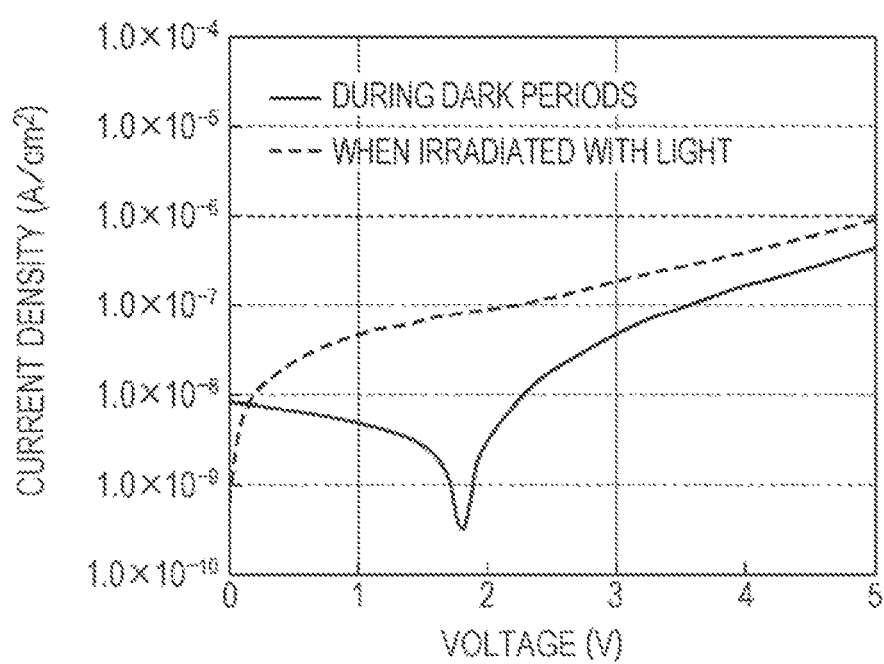
FIG. 5 is a diagram showing a result of J-V measurement of the photoelectric conversion element having the configuration shown in FIG. 4.

Subsequently, current-voltage characteristics of the manufactured photoelectric conversion element are measured (J-V measurement is performed). FIG. 5 shows a result of the measurement. In the photoelectric conversion element of the present example, as shown in FIG. 5, a photo-electric current (a current when irradiated with light) becomes maximum at around 2 V with respect to a dark current (a current during dark periods). In general, a low bias side is a non-injection region and a high bias side is a carrier injection region from an electrode.

Figure 6:
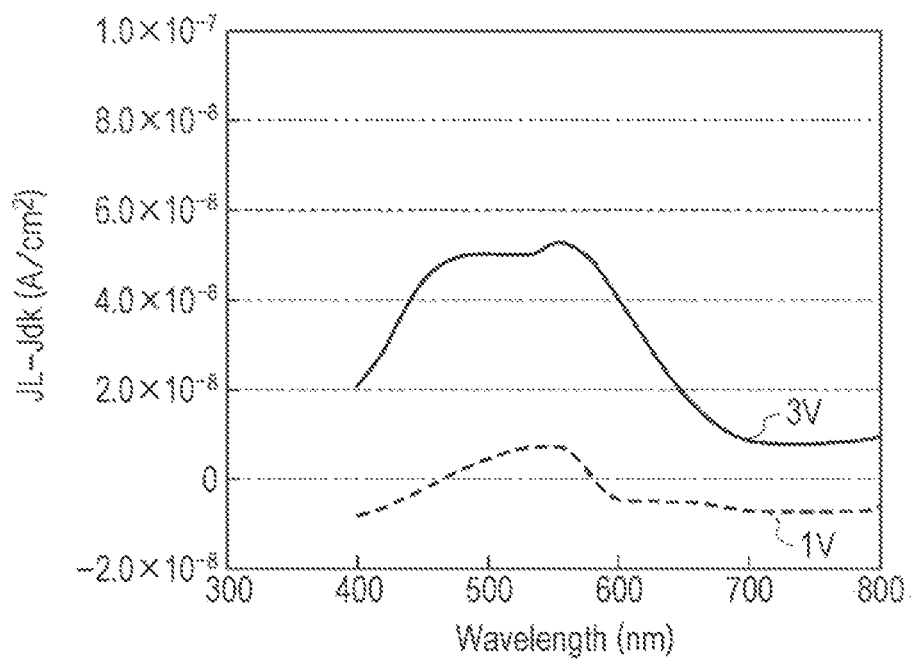
FIG. 6 is a diagram showing spectral sensitivity spectra when a bias voltage is applied to the photoelectric conversion element having the configuration shown in FIG. 4.
Figure 7:
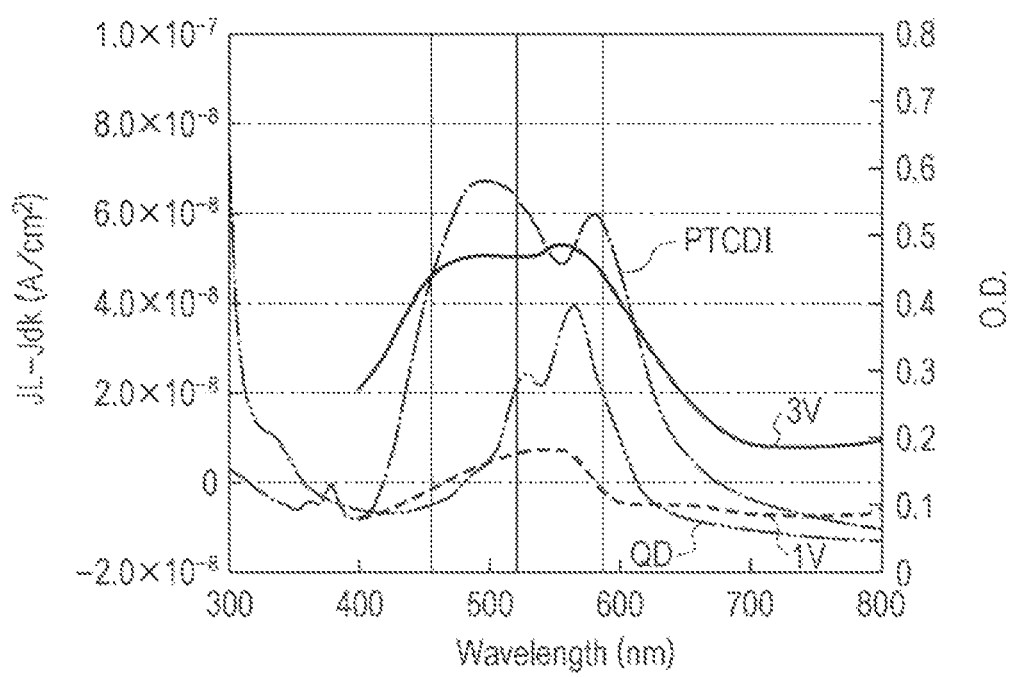
FIG. 7 is a diagram comparing optical spectra when the bias voltage shown in FIG. 6 is applied and optical spectra in a stationary state.

Therefore, spectral sensitivity spectra of the photoelectric conversion element of the present example are measured by setting the bias voltage to 3 V and 1 V. FIG. 6 is a diagram showing the spectral sensitivity spectra when the bias voltage is applied to the photoelectric conversion element of the present example. FIG. 7 is a diagram comparing optical spectra when the bias voltage shown in FIG. 6 is applied and optical spectra in a stationary state.

As shown in FIGS. 6 and 7, the photoelectric conversion element of the present example has a sensing band wider than that of a photoelectric conversion element in which the organic photoelectric conversion portion is formed of only the PTCDI layer or only the QD layer. Further, the wavelength sensitivity characteristics of the photoelectric conversion element of the present example change according to the bias voltage. Form the above results, according to the present disclosure, it is confirmed that a plurality of wavelength regions can be detected even when a light receiving portion, which is provided for each detection wavelength in a conventional manner, is not provided for each detection wavelength.

REFERENCE SIGNS LIST

1 Substrate
2, 3, 6, 7, 42, 43 Electrode
4, 14, 44 Organic photoelectric conversion portion
5 Insulating layer
14a, 14b Organic semiconductor layer
10, 20 Photoelectric conversion element
30 Imaging device
31 Imaging region
32 Vertical drive circuit
33 Column signal processing circuit
34 Horizontal drive circuit
35 Output circuit
36 Control circuit
37 Vertical signal line
38 Horizontal signal line
45 PTCDI layer
46 QD layer

The invention claimed is:
1. A photoelectric conversion element, comprising:
a first electrode;
a second electrode; and
an organic photoelectric conversion portion between the first electrode and the second electrode, wherein
the organic photoelectric conversion portion includes at least a first organic semiconductor layer and a second organic semiconductor layer,
the first organic semiconductor layer and the second organic semiconductor layer are alternately laminated a plurality of times,
the first organic semiconductor layer comprises a first organic semiconductor material,
the second organic semiconductor layer comprises a second organic semiconductor material,
the second organic semiconductor material is different from the first organic semiconductor material,
the first organic semiconductor layer has a first wavelength sensitivity and the second organic semiconductor layer has a second wavelength sensitivity, and
wavelength sensitivity characteristics of the organic photoelectric conversion portion changes based on a voltage applied between the first electrode and the second electrode.

2. The photoelectric conversion element according to claim 1, wherein the first wavelength sensitivity is different from the second wavelength sensitivity.

3. The photoelectric conversion element according to claim 2, wherein the organic photoelectric conversion portion has a configuration in which the first organic semiconductor layer and the second organic semiconductor layer having different wavelength sensitivities are laminated.

4. The photoelectric conversion element according to claim 1, wherein the organic photoelectric conversion portion further comprises a p-type organic semiconductor material and a n-type organic semiconductor material.

5. The photoelectric conversion element according to claim 1, wherein at least one of the first electrode or the second electrode comprises a transparent material.

6. The photoelectric conversion element according to claim 1, wherein
the first organic semiconductor material is a p-type organic semiconductor material, and
the second organic semiconductor material is a n-type organic semiconductor material.

7. An imaging device, comprising:
a photoelectric conversion element, wherein the photoelectric conversion element comprises:
a first electrode;
a second electrode; and
an organic photoelectric conversion portion between the first electrode and the second electrode, wherein:
the organic photoelectric conversion portion includes at least a first organic semiconductor layer and a second organic semiconductor layer,
the first organic semiconductor layer and the second organic semiconductor layer are alternately laminated a plurality of times,
the first organic semiconductor layer comprises a first organic semiconductor material,
the second organic semiconductor layer comprises a second organic semiconductor material,
the second organic semiconductor material is different from the first organic semiconductor material, the first organic semiconductor layer has a first wavelength sensitivity and the second organic semiconductor layer has a second wavelength sensitivity, and wavelength sensitivity characteristics of the organic photoelectric conversion portion changes based on a voltage applied between the first electrode and the second electrode.

8. An optical sensor, comprising:

a photoelectric conversion element, wherein the photoelectric conversion element comprises:

a first electrode;

a second electrode; and an organic photoelectric conversion portion between the first electrode and the second electrode, wherein:

the organic photoelectric conversion portion includes at least a first organic semiconductor layer and a second organic semiconductor layer, the first organic semiconductor layer and the second organic semiconductor layer are alternately laminated a plurality of times, the first organic semiconductor layer comprises a first organic semiconductor material, the second organic semiconductor layer comprises a second organic semiconductor material, the second organic semiconductor material is different from the first organic semiconductor material, the first organic semiconductor layer has a first wavelength sensitivity and the second organic semiconductor layer has a second wavelength sensitivity, and wavelength sensitivity characteristics of the organic photoelectric conversion portion changes based on a voltage applied between the first electrode and the second electrode.

* * * * *